(12) United States Patent
Koizumi et al.

(10) Patent No.: US 7,887,670 B2
(45) Date of Patent: Feb. 15, 2011

(54) GAS INTRODUCING MECHANISM AND PROCESSING APPARATUS FOR PROCESSING OBJECT TO BE PROCESSED

(75) Inventors: Kenjiro Koizumi, Nirasaki (JP); Naoki Yoshii, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 576 days.

(21) Appl. No.: 11/984,843

(22) Filed: Nov. 21, 2007

(65) Prior Publication Data

US 2008/0178810 A1 Jul. 31, 2008

(30) Foreign Application Priority Data

Nov. 27, 2006 (JP) ............................. 2006-317961

(51) Int. Cl.
*C23C 16/00* (2006.01)
*C23F 1/00* (2006.01)
*H01L 21/306* (2006.01)

(52) U.S. Cl. .................................. 156/345.34; 118/715
(58) Field of Classification Search ............. 156/345.34
See application file for complete search history.

(56) References Cited

U.S. PATENT DOCUMENTS

| | | | | |
|---|---|---|---|---|
| 5,851,589 A | * | 12/1998 | Nakayama et al. | ....... 427/248.1 |
| RE36,957 E | * | 11/2000 | Brors et al. | ................. 118/725 |
| 6,590,186 B2 | * | 7/2003 | Tanaka et al. | ............... 219/390 |
| 2004/0082251 A1 | * | 4/2004 | Bach et al. | ..................... 445/60 |
| 2006/0228473 A1 | * | 10/2006 | Satoh et al. | ............. 427/248.1 |

FOREIGN PATENT DOCUMENTS

| | | |
|---|---|---|
| JP | 10-79380 | 3/1998 |
| JP | 2002-217183 | 8/2002 |
| JP | 2004-79985 | 3/2004 |

* cited by examiner

*Primary Examiner*—Michael Cleveland
*Assistant Examiner*—Keath T Chen
(74) *Attorney, Agent, or Firm*—Smith, Gambrell & Russell, LLP

(57) ABSTRACT

The present invention provides a gas introducing mechanism and a processing apparatus for processing an object to be processed, which can supply a gas uniformly over the whole region of a processing space so as to enhance uniformity of a process in the surface of the object to be processed. The gas introducing mechanism 50, which is adapted to provide a process to the object W to be processed, by using the gas, in a processing vessel 4, includes a gas introducing ring member 54 for introducing the gas from the exterior of the processing vessel 4, a disk-like rotary base 56 provided rotatably below a top plate 48 in the processing vessel 4, and a ring-shaped gas injection ring member 60 provided around a rotary base 56 so as to be closer and opposed to the gas introducing ring member 54. A gas injecting slit 58 is provided in the ring-shaped gas injection ring member 60, the slit 58 being formed along the circumferential direction of the rotary base. A ring-shaped gas guide groove 62 is provided on at least either one of opposing side faces of the gas introducing ring member 54 and gas injection ring member 60, along the circumferential direction, corresponding to a gas introducing port.

8 Claims, 6 Drawing Sheets

GAS INTRODUCING MECHANISM AND PROCESSING APPARATUS FOR PROCESSING OBJECT TO BE PROCESSED

BACKGROUND OF THE INVENTION

Cross Reference to Related Applications

This application is based on the prior art Japanese Patent Application No. 2006-317961 filed on Nov. 27, 2006, the entire contents of which are incorporated herein by reference.

Field of the Invention

The present invention relates to a processing apparatus for providing a predetermined process to an object to be processed, such as a semiconductor wafer, and also relates to a gas introducing mechanism for use in the apparatus.

Background Art

Generally, in order to manufacture semiconductor integrated circuits or the like, various processes, such as film forming, etching, oxidation, diffusion, reforming, and the like, are repeatedly provided to each semiconductor wafer comprising a silicon substrate or the like.

For example, in the case of a sheet-feeding type processing apparatus for processing a semiconductor wafer, one sheet for each operation, the wafer is first placed on a table in a processing vessel configured to be evacuated, and the wafer is then heated by a heating means provided at the table and the like. Thereafter, while a predetermined gas is introduced into the processing vessel from a gas supply means provided around the processing vessel and while the interior of the processing vessel is maintained at a predetermined pressure and a predetermined temperature, a predetermined process, for example, a film-forming process, is provided to the wafer (e.g., Patent Documents 1, 2, etc.).

In this case, in order to provide uniformly the predetermined process to the surface of the wafer, it is necessary to apply the processing gas uniformly onto the whole top face of the wafer. Therefore, a shower head structure as disclosed in the Patent Documents 1, 2 is typically employed as the gas supply means. The shower head structure is configured to inject a predetermined gas toward the wafer from gas injection holes formed over substantially the whole face of a top wall above the wafer, so as to supply the predetermined gas, uniformly, to the whole region in a processing space. In order to provide a uniform process in the wafer surface, a processing apparatus having a structure designed to rotate the wafer table itself is also known (Patent Document 3).

Patent Document 1: TOKUKAI No. 2002-217183, KOHO
Patent Document 2: TOKUKAI No. 2004-79985, KOHO
Patent Document 3: TOKUKAIHEI No. 10-79380, KOHO Even in the case of employing the shower head structure as the gas supply means as described above, since a side wall of the vessel, an exhaust port provided at the bottom of the vessel and the like are generally provided asymmetrically, it is quite difficult to diffuse the processing gas uniformly in the processing space, thus making it difficult to avoid occurrence of undesired drift of the processing gas.

Also, with the structure designed to rotate the wafer table itself as described above, in order to provide a greater amount of electric current to a heater while rotating the table, a massive rotary mechanism employing a slip spring or the like should be required, thus inevitably increasing the cost of the apparatus.

SUMMARY OF THE INVENTION

In view of the above problems, the present invention was made to solve them more effectively. Therefore, it is an object of this invention to provide a gas introducing mechanism and a processing apparatus for processing an object to be processed, which can supply a gas uniformly to the whole region in the processing space and thus enhance the uniformity of the process in the surface to be processed, by providing a slit portion for gas injection at a ceiling portion in the processing vessel, such that the slit portion can be optionally rotated.

The present invention is a gas introducing mechanism, which is installed in a tubular processing vessel having a side wall and a top plate for storing an object to be processed therein, and is configured to provide a predetermined process to the object to be processed, by introducing a predetermined gas into the processing vessel, the gas introducing mechanism comprising: a ring-shaped gas introducing ring member including a gas introducing port for introducing the predetermined gas from the exterior of the processing vessel, and provided at the side wall located near the top plate of the processing vessel; a disk-like rotary base rotatably provided below the top plate of the processing vessel; and a ring-shaped gas injection ring member provided around the rotary base, having an outer face opposed to an inner face of the gas introducing ring member, formed along the circumferential direction of the rotary base, and including a slit for injecting the gas, the slit extending through the gas injection ring member, from the outer face toward the inside, wherein a ring-shaped gas guide groove is provided in at least either one of the inner face of the gas introducing ring member and the outer face of the gas injection ring member, corresponding to the gas introducing port.

The present invention is the gas introducing mechanism described above, wherein the rotary base is rotatably supported by a bearing having a sealing function, at a central portion of the top plate.

The present invention is the gas introducing mechanism described above, wherein the rotary base and/or gas injection ring member is supported by a side wall of the gas introducing ring member and/or the side wall of the processing vessel via a bearing.

The present invention is the gas introducing mechanism described above, wherein a length of the slit of the gas injection ring member, which is defined by projection of the slit when viewed from the center of the processing vessel, is set to be longer than the diameter of the object to be processed.

The present invention is the gas introducing mechanism described above, wherein a ceiling exhaust port is provided in the top plate, the ceiling exhaust port being adapted to discharge the atmosphere in a ceiling space defined between the top plate and the rotary base.

The present invention is the gas introducing mechanism described above, wherein the gas introducing port, the gas guide groove and the slit are provided, in a set, in the same horizontal plane.

The present invention is the gas introducing mechanism described above, wherein the gas introducing port, the gas guide groove and the slit are provided, in each set, in a plurality of horizontal planes different from one another.

The present invention is the gas introducing mechanism described above, wherein a raw material gas to be used for performing the predetermined process is flowed through the set of the gas introducing port, the gas guide groove and the slit, provided on a lower stage, while an auxiliary gas is flowed through the set of the introducing port, the gas guide groove and the slit, provided on an upper stage.

The present invention is the gas introducing mechanism described above, wherein a width of a gap between the inner face of the gas introducing ring member and the outer face of the gas injection ring member is within the range of 0.1 to 0.5 mm.

The present invention is a processing apparatus for providing a predetermined process to an object to be processed, comprising: a tubular processing vessel, which is adapted to store the object to be processed therein, and has a side wall and a top plate; an exhaust means for discharging the atmosphere in the processing vessel; a table for supporting the object to be processed thereon; a heating means for heating the object to be processed; and a gas introducing mechanism, which is provided in the processing vessel, and is adapted to introduce a predetermined gas into the processing vessel so as to provide a predetermined process to the object to be processed, wherein the gas introducing mechanism includes: a ring-shaped gas introducing ring member including a gas introducing port for introducing the predetermined gas from the exterior of the processing vessel, and provided at the side wall located near the top plate of the processing vessel; a disk-like rotary base rotatably provided below the top plate of the processing vessel; and a ring-shaped gas injection ring member provided around the rotary base, having an outer face opposed to an inner face of the gas introducing ring member, formed along the circumferential direction of the rotary base, and including a slit for injecting the gas, the slit extending through the gas injection ring member, from the outer face toward the inside, wherein a ring-shaped gas guide groove is provided on at least either one of the inner face of the gas introducing ring member and the outer face of the gas injection ring member, corresponding to the gas introducing port.

With the gas introducing mechanism and the processing apparatus for processing an object to be processed, according to the present invention, the following effects can be obtained.

Since the gas injection ring member having the slit for injecting the gas is rotatably provided at the ceiling portion of the processing vessel, such that the gas can be supplied, with the gas injecting slit being rotated in the circumferential direction of the processing vessel, the gas can be supplied uniformly over the whole region of the processing space, thereby enhancing the uniformity of the process in the surface to be processed.

Additionally, according to the present invention, the auxiliary gas to be supplied from the gas injecting slit provided on the upper stage can serve to press down the raw material gas to be supplied from the gas injecting slit provided on the lower stage, thereby preventing the raw material gas from being diffused upward in the processing space, thus enhancing efficiency in use of the raw material gas.

DETAILED DESCRIPTION OF THE INVENTION

Examples

Hereinafter, one embodiment of a gas introducing mechanism and a processing apparatus for processing an object to be processed, according to the present invention, will be described in detail with reference to the accompanying drawings.

Figure 1:
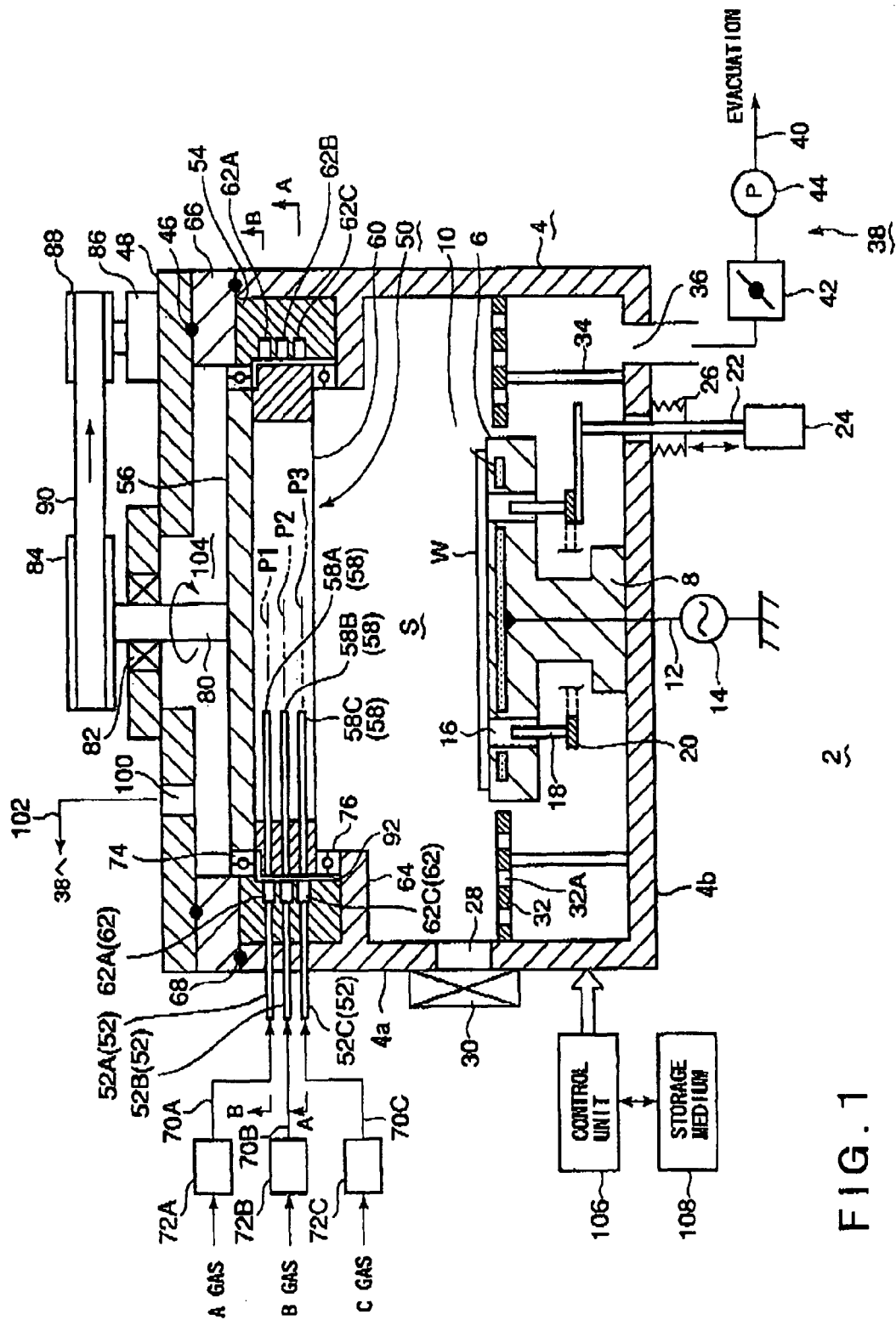
FIG. 1 is a cross sectional vew showing a construction of a processing apparatus according to the present invention, which is used for processing an object to be processed.
Figure 2:
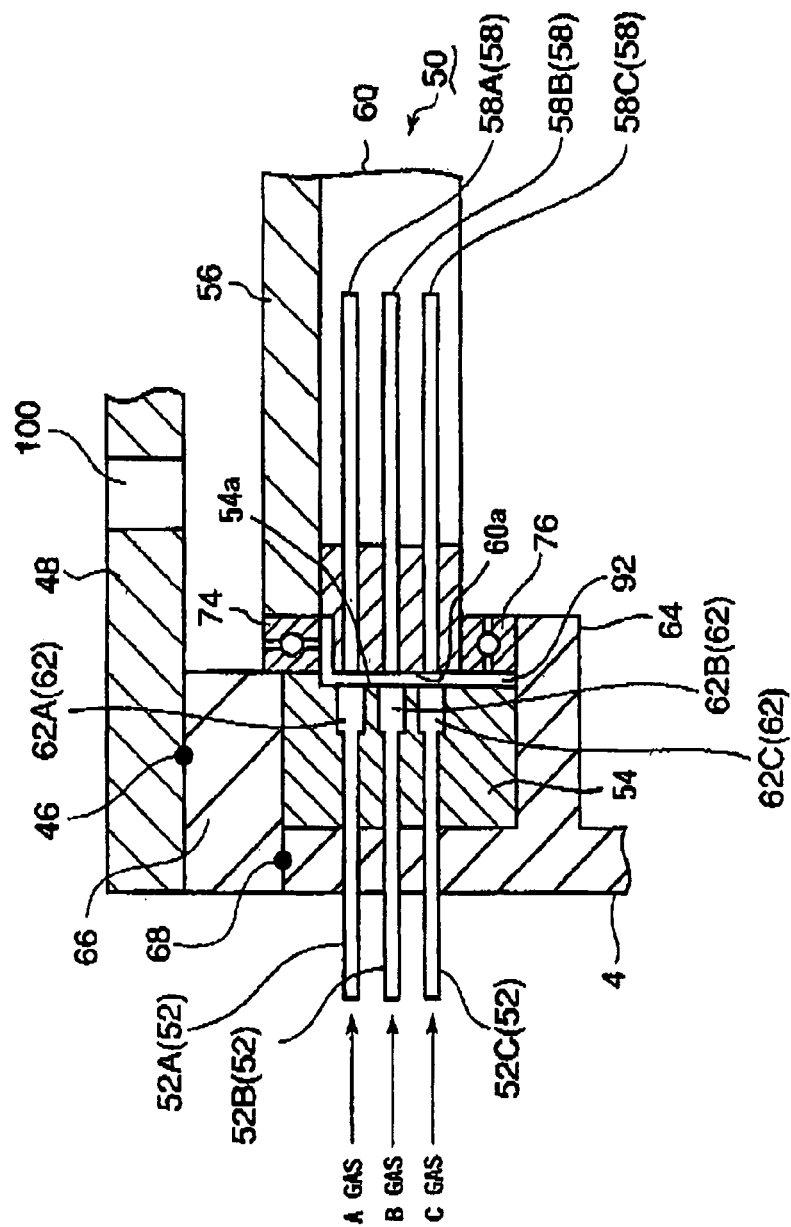
FIG. 2 is an enlarged cross sectional view showing a part of a gas introducing mechanism shown in FIG. 1.
Figure 3:
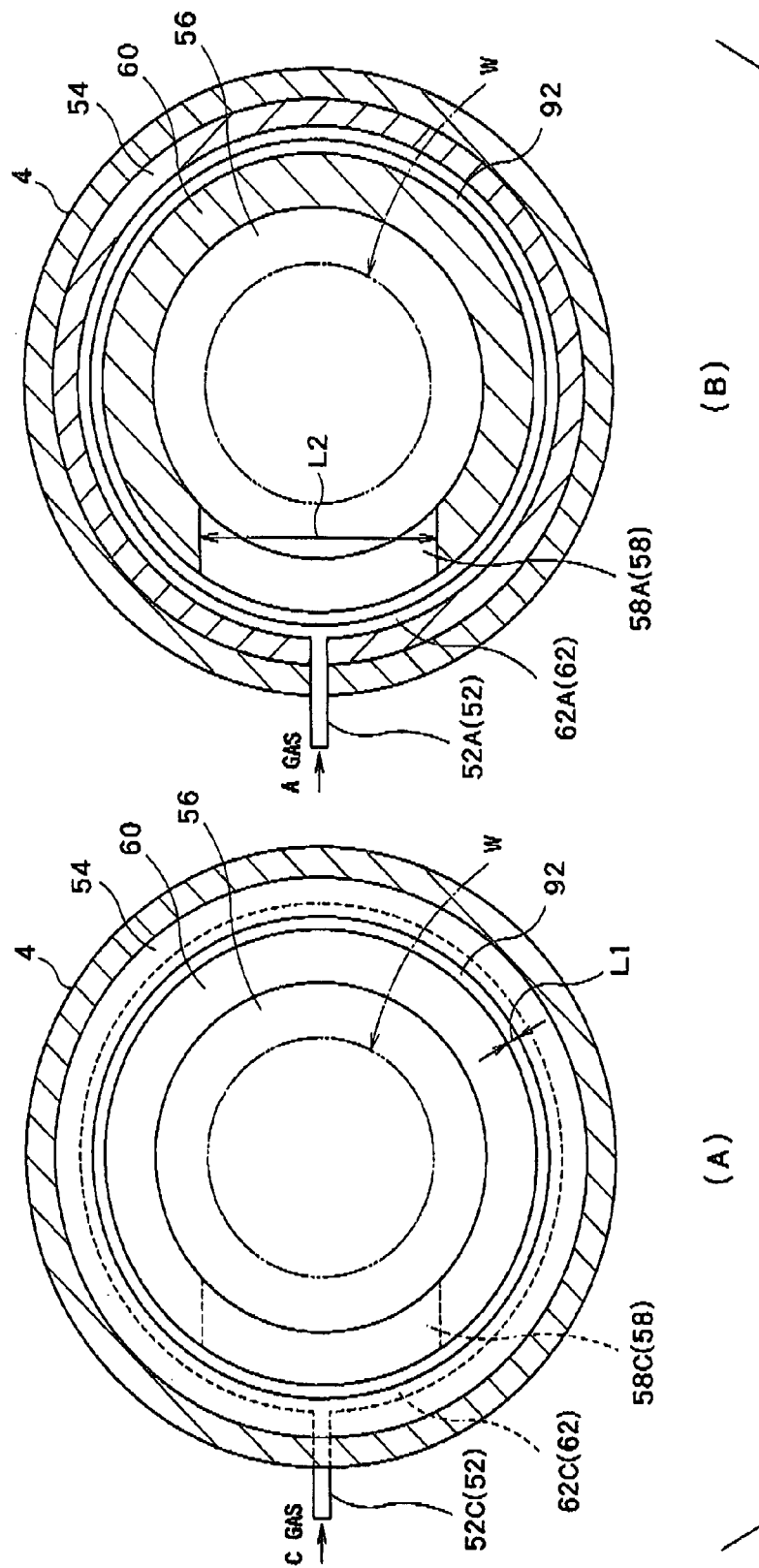
FIGS. 3(A) and 3(B) are schematic cross sectional views, each showing a cross section taken along each arrow shown in FIG. 1.
Figure 4:
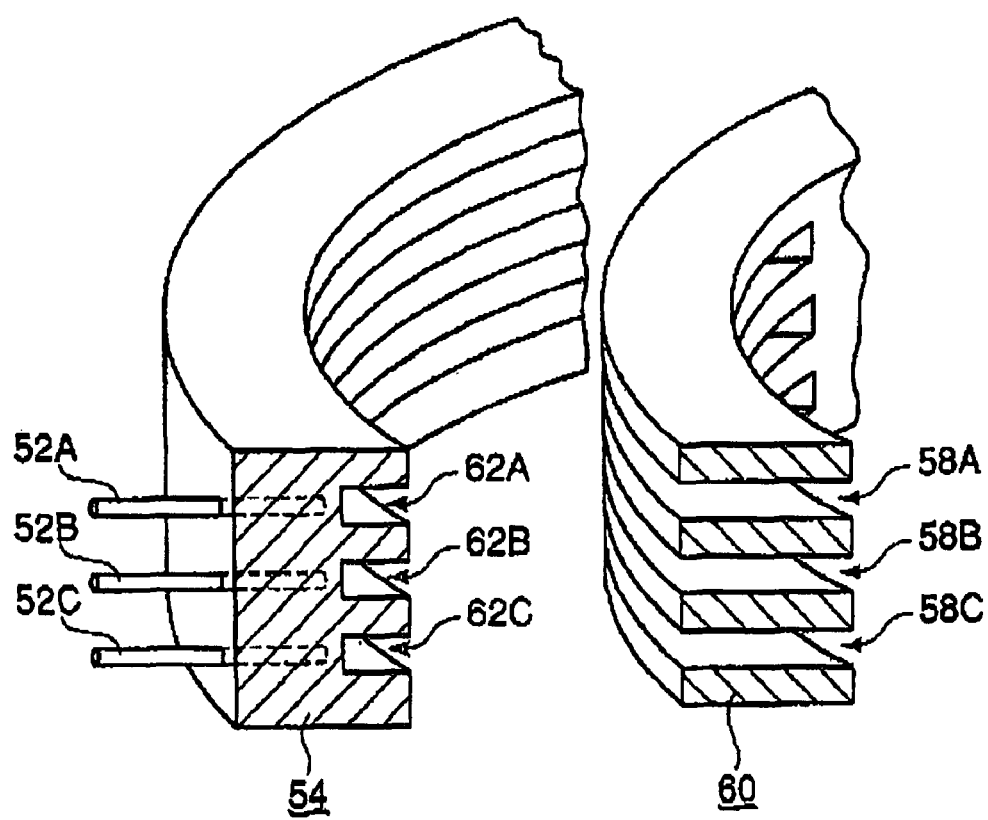
FIG. 4 is a partially sectioned and exploded perspective view showing exploded states of a part of the gas introducing mechanism shown in FIG. 1.

FIG. 1 is a cross sectional view showing a construction of a processing apparatus, according to the present invention, for processing an object to be processed, FIG. 2 is an enlarged cross sectional view showing a part of a gas introducing mechanism shown in FIG. 1, FIGS. 3(A) and 3(B) are schematic cross sectional views, each showing a cross section taken along each arrow shown in FIG. 1, and FIG. 4 is a partially sectioned and exploded perspective view showing exploded states of a part of the gas introducing mechanism shown in FIG. 1.

As shown in the drawings, a processing apparatus 2 for processing an object to be processed includes a processing vessel 4 with a tubular shape, made of, for example, an aluminum alloy, and a table 6 located in the processing vessel 4 made of an aluminum alloy.

The processing vessel 4 includes a side wall 4a and a bottom portion 4b. The table 6 in the processing vessel 4 is provided by attaching and fixing the table 6 onto a leg portion 8 extending upward from the bottom portion 4a of the vessel 4, whereby the object to be processed, for example, a semiconductor wafer W, can be placed on a top face of the table 6.

In the table 6, a heating means 10 comprising, for example, a resistance heater, is embedded. To the heating means 10, a heating power supply 14 is connected via an electric supply line 12. Thus, the wafer W placed on the table 6 can be heated to a desired temperature.

In the table 6, three pin insertion holes 16 (only two of the holes are shown in the drawing) are provided, while being disposed at an equal interval along the circumferential direction. In addition, lifting pins 18 are located below the table 6, corresponding to each pin insertion hole 16. Each lifting pin 18 is connected commonly to a ring member 20, and the ring member 20 is configured to move in the vertical direction by the action of a lifting rod 22 provided to extend through the bottom portion of the vessel. Accordingly, upon placing the wafer W on the table 6, the lifting pins 18 are raised through the pin insertion holes 16 and projected upward from the top face of the table 6, so as to support the wafer W thereon. Thus, the wafer W can be transferred between the so-projected lifting pins 18 and a carrier arm (not show) to be horizontally advanced into a wafer transfer section. For instance, the size or diameter of the wafer W is 300 mm.

In this case, a lifting actuator 24 is provided at a lower portion of the lifting rod 22, and a metallic flexible bellows 26 allowing vertical movement of the lifting rod 22 is provided at an insertion point of the vessel bottom portion where the lifting rod 22 is inserted, so as to keep air tightness in the processing vessel 4.

In the side wall 4a of the processing vessel 4, an opening 28 for carrying in and carrying out the wafer W therethrough is formed, and a gate valve 30 is provided around the opening 28. A gas distribution plate 32 is arranged between an inner wall of the processing vessel 4 and the outer periphery of the table 6, with a plurality of gas holes 32A, for distributing a gas flow to be flowed downward, being formed therein. The gas distribution plate 32A is supported by posts 34 respectively extending upward from the vessel bottom portion 4b. An exhaust port 36 is provided in the vessel bottom portion 4b, and an exhaust means 38 for discharging the atmosphere in the processing vessel 4 is connected to the exhaust port 36. The exhaust means 38 includes a pressure control valve 42 and an exhaust pump 44, while these components 42, 44 are arranged successively along an exhaust passage 40. By employing a vacuum pump as the exhaust pump 44, the processing vessel 4 can be evacuated.

A top portion of the processing vessel 4 is opened, around which a top plate 48 is airtightly attached by means of a sealing member 46, such as an O-ring, via a pressing plate 66 which will be detailed below. Below the top plate 48 of the processing vessel 4, a gas introducing mechanism 50 according to the present invention is provided, which serves to introduce a predetermined gas necessary for a process into a processing space S above the table 6. The gas introducing mechanism 50 includes a gas introducing port 52 for introducing the predetermined gas from the exterior of the processing vessel 4, and is comprised of a ring-shaped gas introducing ring member 54 provided at the side wall (vessel side wall) 4a located near the top plate 48 of the processing vessel 4, a disk-like rotary base 56 rotatably provided below the top plate 48 of the processing vessel 4, a ring-shaped gas injection ring member 60 provided around the rotary base 56 and including a gas injecting slit 58, and a ring-shaped gas guide groove 62 provided on at least either one of a side face (outer face) 60a of the gas injection ring member 60 and a side face (inner face) 54a of the gas introducing ring member 54 opposed to the outer face 60a, for example, on the inner face 54a of the gas introducing ring member 54.

Specifically, the gas introducing ring member 54 has a circular ring-like shape having a predetermined thickness, is made of, for example, an aluminum alloy, and is disposed on a ring-shaped supporting shelf 64 provided along an upper portion of the side wall 4a of the processing vessel 4. The gas introducing ring member 54 is provided along the circumferential direction of the side wall 4a of the vessel 4 such that the gas introducing ring member 54 can substantially contact internally with the side wall 4a of the vessel 4. Further, the gas introducing ring member 54 is firmly held, from above, by the ring-shaped pressing plate 66. The pressing plate 66 is airtightly and fixedly attached to the side wall 4a of the vessel 4 via a sealing member 68, such as an O-ring or the like.

As the gas introducing port 52, one or more ports are provided, corresponding to the kinds of gases to be used, and herein, for example, as shown in FIG. 2, three gas introducing ports 52A, 52B, 52C are provided, in a multi-stage fashion, in respectively different three horizontal planes arranged in the vertical direction. The gas introducing ports 52A, 52B, 52C respectively include gas passages 70A, 70B, 70C respectively provided to extend horizontally through both of the gas introducing ring member 54 and the vessel side wall. To the middle portions of the gas introducing passages 70A, 708, 70C, flow rate controllers 72A, 72B, 72C, such as mass flow controllers, are provided respectively, so that A gas, B gas and C gas can be supplied, while being controlled, as necessary gases, respectively.

In the inner side face (inner surface) 54a of the gas introducing ring member 54, namely the side face 54a opposed to the side face 60a of the gas injection ring member 60, as shown in FIGS. 3 and 4, the ring-shaped gas guide groove 62 is formed to have a substantially U-shaped cross section along the circumferential direction. In this embodiment, three gas guide grooves 62A, 62B, 62C are formed, in multi-stage fashion, in respectively different three horizontal planes arranged in vertical direction, corresponding to the respective gas passages 70A, 70B, 70C of the gas introducing ports 52A, 52B, 52C (see FIG. 4). As such, each gas to be introduced into the vessel can be flowed in the circumferential direction along each corresponding gas guide groove 62A, 62B, 62C. The size of the cross section of each gas guide groove 62A, 62B, 62C is about 3 mm long and 10 mm in width.

The rotary base 56 has a circular disk, and is made of, for example, an aluminum alloy. To a central portion of the rotary base 56, a rotary shaft 80 is provided to extend upward. The rotary shaft 80 is supported by the top plate 48 via a bearing 82 having a sealing function, such as a magnetic fluid sealing bearing. The rotary base 56 is configured to be rotated, by providing a timing belt 90 between a pulley 84 provided to the rotary shaft 80 and a pulley 88 of a driving motor 86 provided on the top plate 48. Around the rotary base 56, the ring-shaped gas injection ring member 60 formed of, for example, an aluminum alloy, is provided.

The outer periphery of the rotary base 56 is rotatably supported by the pressing plate 66 and the gas introducing ring member 54 via a bearing 74. The lower periphery of the gas injection ring member 60 is rotatably supported by the supporting shelf 64 via a bearing 76. In this case, a radial bearing is used as the upper bearing 74 while a thrust bearing is employed as the lower bearing 76 so as to prevent unstable rotation of the rotary base 56 and gas injection ring member 60. It is noted that one or both of the two bearing 74, 76 may be eliminated, provided that the mechanical strength of the bearing 82 having a sealing function is sufficient to hold the central axis of the rotary base 56.

In this embodiment, the outer circumferential side face 60a of the gas injection ring member 60 and the inner circumferential side face 54a of the gas introducing ring member 54 will be closer to but not in contact with each other, as such defining a slight gap (space) 92 therebetween (see also FIGS. 2 and 3). The width L1 of the gap 92 is within the range of 0.1 to 0.5 mm, preferably 0.1 to 0.3 mm. If the gap 92 is greater than 0.5 mm, an amount of the gas leaking out through the gap 92 will be undesirably large. To facilitate understanding of this invention in the respective drawings, the width of the gap 92 is depicted in an exaggerated way, and FIG. 4 shows a state in which the gas introducing member 54 is separated from the gas injection ring member 60.

To the gas injection ring member 60, a gas injecting slit 58 is provided, horizontally corresponding to the gas guide grove 62. In this embodiment, three gas injecting slits 58A, 58B, 58C are provided, respectively corresponding to the gas guide grooves 62A, 62B, 62C (see FIG. 2). Each of the gas injecting slits 58A, 58B, 58C is formed into a circular arc shape along the circumferential direction of the gas injection ring member 60 with an equal width.

A length L2 of each slit 58A, 58B, 58C, which is defined by projection of the slit when viewed from the center of the processing vessel 4, i.e., a length of the chord of each arcuate slit 58A, 58B, 58C, is set to be longer than the diameter of the wafer W (see FIG. 3). Thus, each gas can be flowed to cover all the diameter of the wafer W, laterally thereto. The width (thickness) of each slit 58A, 58B, 58C is set to be equal to or less than the thickness (longitudinal width) of each gas guide groove 62. For instance, it is about 1 mm. In this embodiment, the gas introducing port 52A, gas guide groove 62A and slit 58A are arranged in an upper horizontal plane P1 so as to constitute together an upper stage set, the gas introducing port 52B, gas guide groove 62B and slit 58B are arranged in an intermediate horizontal plane P2 so as to constitute together an intermediate stage set, and the gas introducing port 52C, gas guide groove 62C and slit 58C are arranged in a lower horizontal plane P3 so as to constitute together a lower stage set.

The upper horizontal plane, intermediate horizontal plane and lower horizontal plane are arranged in different positions in the vertical direction.

Returning to FIG. 1, a ceiling exhaust port 100 is formed in the top plate 48, and is connected with an exhaust means 38 via an exhaust pipe 102. Consequently, the atmosphere in a ceiling space defined between the top plate 48 and the rotary base 56 can be evacuated.

The control for each component is performed by a control unit 106, for example, based on a program prepared in advance. In this case, the program including instructions for controlling each component is stored in a storage medium 108, such as a flexible disk, a compact disk, a flash memory, a hard disk or the like.

Next, a processing method to be performed by using the processing apparatus 2 constructed as described above will be discussed, also referring to the other drawings.

Figure 5:
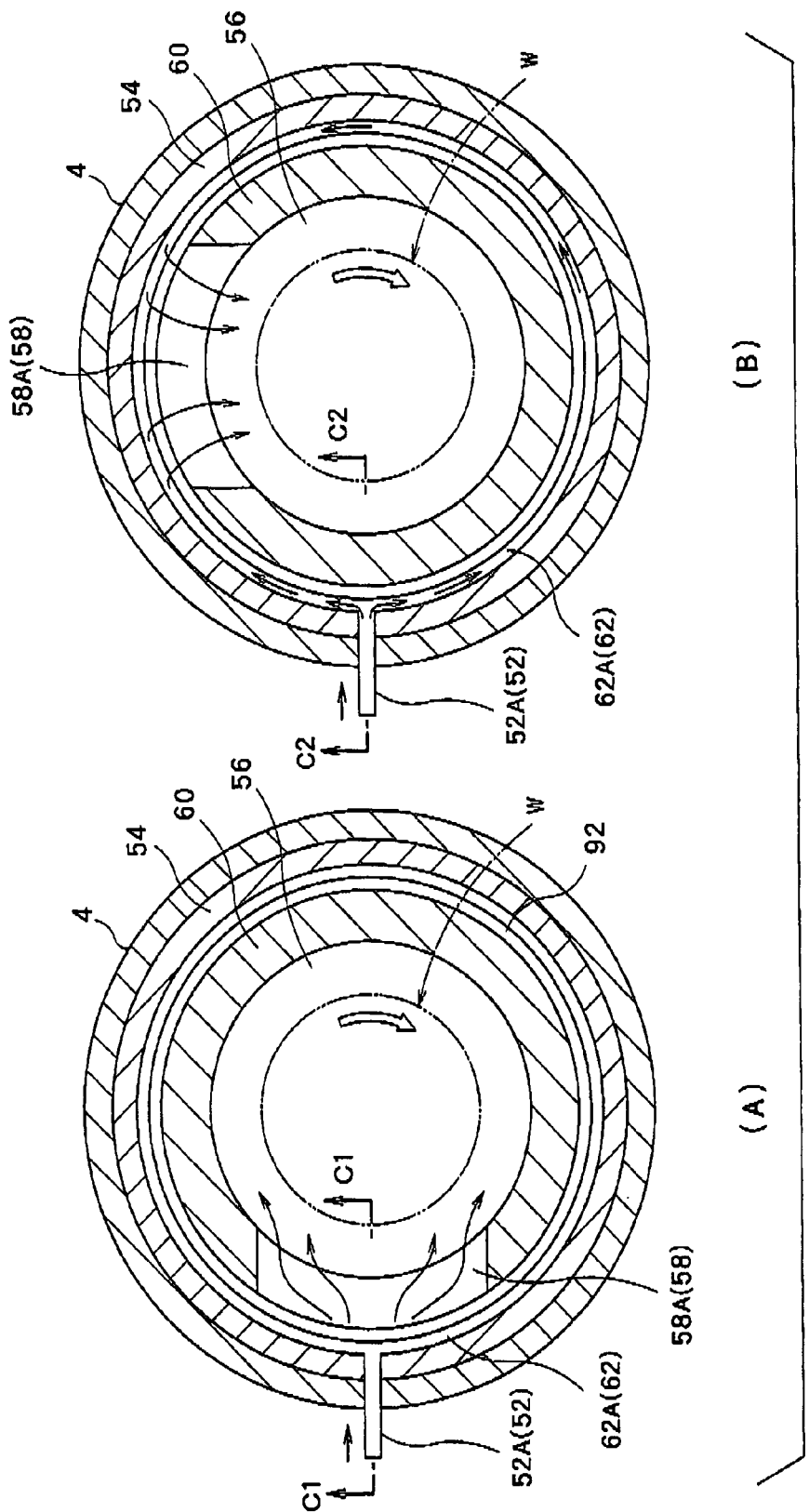
FIGS. 5(A) and 5(B) are schematic cross sectional views, each showing a cross section taken along an arrow (line B-B) shown in FIG. 1, for illustrating a relationship between the rotation of a gas injection ring member and each gas flow.
Figure 6:
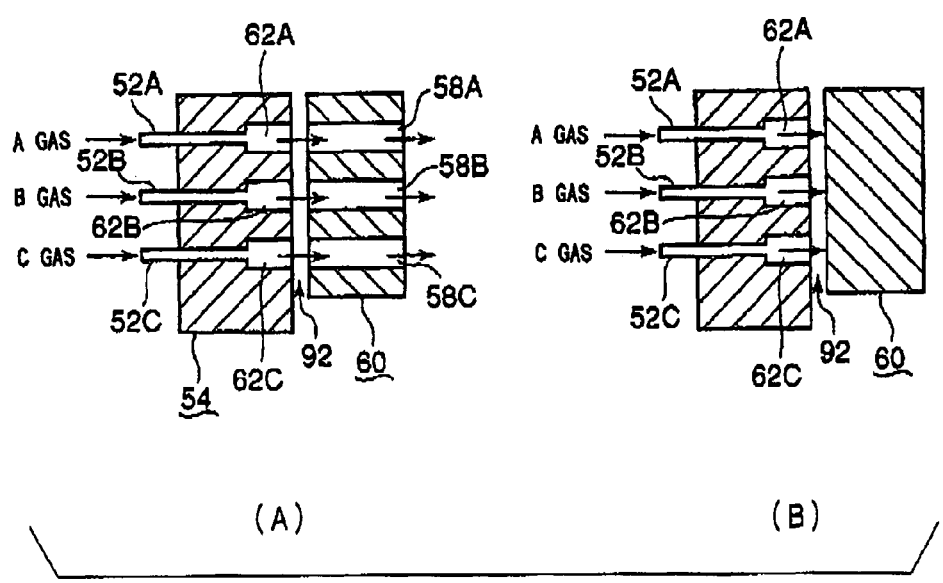
FIGS. 6(A) and 6(B) are schematic cross sectional views, each showing a cross section taken along each arrow shown in FIG. 5.

FIG. 5 includes schematic cross sections, each showing a cross section taken along an arrow (line B-B) shown in FIG. 1, for illustrating a relationship between the rotation of the gas injection ring member and each gas flow, FIG. 6 includes schematic cross sections, each showing a cross section taken along an arrow shown in FIG. 5, wherein FIG. 6(A) is a cross section taken along line C1-C1 shown in FIG. 5(A), and FIG. 6(B) is a cross section taken along line C2-C2 shown in FIG. 5(B).

First, the gate valve 30 is opened, and an unprocessed semiconductor wafer W is carried into the processing vessel 4, by using a carrier arm (not shown), via the opening 28 of the opened gate valve 30. The wafer W is then transferred from the carrier arm onto the lifting pins 18 raised from below the table 6. After the carrier arm is taken out from the processing vessel 4, the lifting pins 18 are lowered so as to transfer and place the wafer W supported on top ends of the lifting pins 18, onto the top face of the table 6.

Thereafter, the gate valve 30 is closed to hermetically seal the processing vessel 4, and the wafer W is heated up to a predetermined processing temperature and maintained at the temperature, by using the heating means 10 provided in the table 6. Simultaneously, the atmosphere of the processing vessel 4 is vacuumed by using the exhaust means 38, while a predetermined gas is flowed into the vessel from the gas introducing mechanism 50 provided in the vicinity of the top plate 48 of the processing vessel 4. Thus, a predetermined process is performed toward the wafer W while keeping a predetermined processing pressure.

Now, the gas supply due to the gas introducing mechanism 50 will be described in more detail. The A gas, B gas and C gas are flowed through the gas passages 70A, 70B and 70C, with the flow rate being controlled by the flow rate controllers 72A, 72B, 72C, respectively. Thereafter, these gases enter the gas introducing ports 52A, 52B and 52C provided in the gas introducing ring member 54, and are then flowed into the gas guide grooves 62A, 62B and 62C communicating with the gas introducing ports 52A, 52B and 52C, respectively.

At this time, the driving motor 86 provided on the top plate 48 of the processing vessel 4 is already driven to rotate. Thus, the driving force is transmitted to the rotary shaft 80 via the timing belt 90, and hence the rotary base 56 and the gas injection ring member 60 attached thereto are already rotated at a predetermined number of revolution while being supported by the respective bearings 74, 76. For example, the revolution speed is approximately 100 rpm.

The A gas, B gas and C gas respectively reached the gas guide grooves 62A, 62B and 62C are then flowed through and along the gas guide grooves 62A, 62B, 62C, respectively, depending on the rotational position of the gas injection ring member 60, or otherwise are directly injected from the respective slits 58A, 58B and 58C into the processing space S without flowing through the grooves.

Specifically, as shown in FIGS. 5(A) and 6(A), when each slit 58A, 58B, 58C is positioned to be opposed to each gas introducing port 52A, 52B, 52C, each gas can be flowed and spread directly from each gas introducing port 52A, 52B, 52C into each slit 58A, 58B, 58C, and is then supplied into the processing space S through each slit 58A, 58B, 58C.

FIG. 5(B) shows a state to be seen by rotating the gas injection ring member 60, by approximately 90 degrees, from the state shown in FIG. 5(A). As shown in FIGS. 5(B) and 6(B), when each slit 58A, 58D, 58C is positioned not to be opposed to each gas introducing port 52A, 52B, 52C, each of the A gas, B gas and C gas will be flowed both in the left and right directions along the inner wall of each corresponding gas guide groove 62A, 62B, 62C, and then supplied, as described above, into the processing space S through each slit 58A, 58B, 58C.

In this case, as described above, since the width L1 of the gap 92 between the side wall of the gas introducing ring member 54 and the side wall of the gas injection ring member 60 is very small, for example, about 0.1 to 0.5 mm, the amount of the gas to be leaked downward and upward from the gap 92 is significantly small, and the majority of the gas will be flowed through each gas guide groove 62A, 62B, 62C, as discussed above.

As a result, even through the gas injection ring member 60 will take any rotational position, each gas can be injected toward the processing space S, continuously, from each slit 58A, 58B, 58C. In other words, since each gas is injected from each slit 58A, 58B, 58C while each slit is rotating in the circumferential direction of the vessel, each gas can be always supplied uniformly into the whole region of the processing space S, thereby to significantly enhance uniformity of processing the surface of the wafer. For instance, when the process is film-forming, the uniformity of the thickness of a film to be deposited on the wafer surface can be securely enhanced.

In this case, the length L2 of the chord of each arcuate slit 58A, 58B, 58C is set to be equal to or larger than the diameter of the wafer W. Therefore, each gas can be always supplied to cover the entire lateral width of the wafer W, as such further enhancing the uniformity of processing the surface of the wafer W. It should be noted that the length L2 of the chord of each slit 58A, 58B, 58C is not limited to the size described above, but may be shorter than the diameter of the wafer W.

Although being a very small amount, the flow of each gas into the ceiling space 104, via the gap 92 and upper bearing 74, with the gas being flowed along each gas guide groove 61A, 62B, 62C, can not be avoided. However, since the atmosphere in the ceiling space 104 is evacuated via the ceiling exhaust port 100, the gas flow into the ceiling space will never badly affect the wafer processing.

In the case of using a raw material gas, such as a film-forming gas, as well as an auxiliary gas for reducing the raw material gas or the like, the raw material gas may be flowed through the slits located on the lower stages among the three slits, for example, the slits 58B, 58C, while the auxiliary gas may be flowed through the slits located on the upper stages, for example, the slits 58A, 58B, rather than the lower-stage slits.

In this manner, since the flow of the auxiliary gas to be created over the flow of the raw material gas can press down the raw material gas, diffusion in the upward direction of the raw material gas in the processing space S can be prevented, as such achieving more efficient use of the raw material gas. In such a film-forming process, a silane-based gas, for example, a mono-silane gas, can be used as the raw material gas, while a reducing gas, for example, H2 gas, can be used as the auxiliary gas, upon forming a silicon film. Such a film-forming process employing the raw material gas and the auxiliary gas can also be applied to the case of forming a metal film, a nitride film or the like.

Other than the film-forming process described above, the type of the process to be performed by the processing apparatus of the present invention includes etching, oxidation, diffusion, reforming and the like. The kinds of gases, such as the A gas, B gas, C gas and the like will depend on the type of the process.

It should be noted that, in the processing apparatus of this invention, the size of the wafer W to be processed is not limited in particular, and hence the present invention can be applied to the wafers of all the diameter size within the range of from 4 inches to 12 inches (300 mm).

In this embodiment, while the processing vessel 4 and the gas introducing ring member 54 are provided separately, these components may be provided in an integrally molded form.

While the case of employing the resistance heater embedded in the table 6 has been described, herein, by way of example, as the heating means 10, it is not limited to this aspect. For instance, the present invention can also be applied to a processing apparatus, in which the table 6 is molded into a thin form, and an a plurality of heating lamps, as the heating means, are provided below the table 6, whereby the wafer can be heated indirectly due to the heating lamps.

In the embodiment described above, while the single water type processing apparatus for processing the wafer W, one sheet for each operation, has been discussed, by way of example, the apparatus is not limited of this type. For example, the present invention can also be applied to the so-called batch-type processing apparatus, in which a detachable thin auxiliary plate is attached onto the table 6, whereby a plurality of wafers each having a small diameter can be placed on the auxiliary table such that the plurality of wafers can be processed simultaneously. In this case, by carrying in and carrying out the auxiliary table itself, the plurality of wafers can be carried at the same time.

In the embodiment described above, while the semiconductor wafer has been discussed, by way of example, as the object to be processed, it is not limited to this aspect. For instance, the present invention can also be applied to glass substrates, LCD substrates, ceramic substrates or the like.

The invention claimed is:

1. A gas introducing mechanism, which is installed in a tubular processing vessel having a side wall and a top plate for storing an object to be processed therein, and which is configured to provide a predetermined process to the object to be processed by introducing a predetermined gas into the processing vessel, the gas introducing mechanism comprising:

a ring-shaped gas introducing ring member including a gas introducing port for introducing the predetermined gas from the exterior of the processing vessel, and provided at the side wall located near the top plate of the processing vessel;

a disk-like rotary base rotatably provided below the top plate of the processing vessel; and a ring-shaped gas injection ring member provided around the rotary base, having an outer face opposed to an inner face of the gas introducing ring member, formed along the circumferential direction of the rotary base, and including a slit for injecting the gas, the slit extending through the gas injection ring member, from the outer face toward the inside, wherein a ring-shaped gas guide groove is provided on at least either one of the inner face of the gas introducing ring member and the outer face of the gas injection ring member, corresponding to the gas introducing port, wherein the rotary base is rotatably supported by a bearing having a sealing function, at a central portion of the top plate, and wherein the rotary base and/or gas injection ring member is supported by a side wall of the gas introducing ring member and/or the side wall of the processing vessel via a bearing.

2. The gas introducing mechanism according to claim 1, wherein a length of the slit of the gas injection ring member, which is defined by projection of the slit when viewed from the center of the processing vessel, is set to be longer than the diameter of the object to be processed.

3. The gas introducing mechanism according to claim 1, wherein a ceiling exhaust port is provided in the top plate, the ceiling exhaust port being adapted to discharge the atmosphere in a ceiling space defined between the top plate and the rotary base.

4. The gas introducing mechanism according to claim 1, wherein the gas introducing port, the gas guide groove and the slit are provided, in a set, in the same horizontal plane.

5. The gas introducing mechanism according to claim 1, wherein the gas introducing port, the gas guide groove and the slit are provided, in each set, in a plurality of horizontal planes different from one another.

6. The gas introducing mechanism according to claim 5, wherein a raw material gas to be used for performing the predetermined process is flowed through the set of the gas introducing port, the gas guide groove and the slit, provided on a lower stage, while an auxiliary gas is flowed through the set of the introducing port, the gas guide groove and the slit, provided on an upper stage.

7. The gas introducing mechanism according to any one of claims 1 and 2 to 6, wherein a width of a gap between the inner face of the gas introducing ring member and the outer face of the gas injection ring member is within the range of 0.1 to 0.5 mm.

8. A processing apparatus for providing a predetermined process to an object to be processed, comprising:

a tubular processing vessel, which is adapted to store the object to be processed therein, and which has a side wall and a top plate;

an exhaust means for discharging the atmosphere in the processing vessel; a table for supporting the object to be processed thereon;

a heating means for heating the object to be processed; and a gas introducing mechanism, which is provided in the processing vessel, and which is adapted to introduce a predetermined gas into the processing vessel so as to provide a predetermined process to the object to be processed, wherein the gas introducing mechanism includes:

a ring-shaped gas introducing ring member including a gas introducing port for introducing the predetermined gas from the exterior of the processing vessel, and provided at the side wall located near the top plate of the processing vessel;

a disk-like rotary base rotatably provided below the top plate of the processing vessel; and a ring-shaped gas injection ring member provided around the rotary base, having an outer face opposed to an inner face of the gas introducing ring member, formed along the circumferential direction of the rotary base, and including a slit for injecting the gas, the slit extending through the gas injection ring member, from the outer face toward the inside, wherein a ring-shaped gas guide groove is provided on at least either one of the inner face of the gas introducing ring member and the outer face of the gas injection ring member, corresponding to the gas introducing port, wherein the rotary base is rotatably supported by a bearing having a sealing function, at a central portion of the top plate, and wherein the rotary base and/or gas injection ring member is supported by a side wall of the gas introducing ring member and/or the side wall of the processing vessel via a bearing.

* * * * *